(12) United States Patent
Ewanchuk et al.

(10) Patent No.: US 11,630,154 B2
(45) Date of Patent: Apr. 18, 2023

(54) METHOD AND DEVICE FOR MONITORING CONNECTION OF SEMICONDUCTOR OF POWER MODULE

(71) Applicant: MITSUBISHI ELECTRIC CORPORATION, Tokyo (JP)

(72) Inventors: Jeffrey Ewanchuk, Rennes (FR); Julio Brandelero, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 138 days.

(21) Appl. No.: 17/423,618

(22) PCT Filed: Jan. 20, 2020

(86) PCT No.: PCT/JP2020/002640
§ 371 (c)(1),
(2) Date: Jul. 16, 2021

(87) PCT Pub. No.: WO2020/179279
PCT Pub. Date: Sep. 10, 2020

(65) Prior Publication Data
US 2022/0107363 A1  Apr. 7, 2022

(30) Foreign Application Priority Data

Mar. 7, 2019 (EP) ..................... 19161336

(51) Int. Cl.
*G01R 31/319* (2006.01)
*G01R 31/40* (2020.01)

(52) U.S. Cl.
CPC ....... *G01R 31/31924* (2013.01); *G01R 31/40* (2013.01)

(58) Field of Classification Search
CPC ... G01R 31/31924; G01R 31/40; G01R 31/70
(Continued)

(56) References Cited

U.S. PATENT DOCUMENTS

| 9,743,480 B2 * | 8/2017 | Chen ...................... H05B 45/44 |
| 11,114,430 B2 * | 9/2021 | Li ........................... G01R 31/52 |
| 2011/0199046 A1 * | 8/2011 | Tsai ..................... H02M 3/3376 |
| | | 320/108 |

OTHER PUBLICATIONS

International Search Report (PCT/ISA/210) issued in PCT/JP2020/002640 dated Mar. 23, 2020.
(Continued)

*Primary Examiner* — Giovanni Astacio-Oquendo
(74) *Attorney, Agent, or Firm* — Birch, Stewart, Kolasch & Birch, LLP (57) ABSTRACT

The invention: determines if the duration of the conducting state of the semiconductors in a first cycle of the pulse width modulation is upper than a predetermined duration, measures, during the conducting state of the semiconductors at a second cycle, the voltage provided to the load, sequentially disables the conduction of each semiconductor during a part of the duration of the conducting state of the semiconductors in a third cycle and measures the voltage provided to the load, determines the differences between the voltage measured during the second cycle and each voltage measured during the third cycle, orders the differences according to their value, checks if the determined order is identical to an order stored in a memory of the device and determines that one connection of one semiconductor is deteriorated if the order is changed.

17 Claims, 6 Drawing Sheets

(58) Field of Classification Search
USPC .................................. 324/762.01, 537, 500
See application file for complete search history.

(56) References Cited

OTHER PUBLICATIONS

Written Opinion (PCT/ISA/237) issued in PCT/JP2020/002640 dated Mar. 23, 2020.

* cited by examiner

| Rank | Switch |
|------|--------|
| 1    | S1     |
| 2    | S2     |
| 3    | S3     |
| 4    | S4     |
| 5    | S6     |
| 6    | S5     |

Fig. 9A

| Rank | Switch |
|------|--------|
| 1    | S1     |
| 2    | S3     |
| 3    | S4     |
| 4    | S6     |
| 5    | S2     |
| 6    | S5     |

Fig. 9B

METHOD AND DEVICE FOR MONITORING CONNECTION OF SEMICONDUCTOR OF POWER MODULE

TECHNICAL FIELD

The present invention relates generally to a method and a device for monitoring the connections of semiconductors of a power module.

BACKGROUND ART

Power modules are composed of multiple semiconductors in parallel in order to achieve higher power levels in the power modules without manufacturing large-area semiconductors. Wire bonds are often employed as an electrical interconnection technology for connecting the semiconductors of the power modules. Wire bonds are identified as a major contribution to power module failures. As the wire bonds age due to thermomechanical fatigue, they lift off, causing a re-distribution of current in the power module. However, as the remaining wire bonds are forced to carry the load current, the temperature of the remaining wire bonds increase, and increase their own rate of degradation. The last wire bond remaining across the set of parallel semiconductors can then experience a very high current density, causing the metallization to melt, and potentially induce a catastrophic short circuit or a complete open circuit within the power module.

Condition monitoring for wire bonds typically exploits the fact that the electrical resistance during the conduction of a semiconductor, like for example an IGBT or a MOSFET increases with a lower number of wire bond contacts. Furthermore, as the metallization also experiences aging, the on-state voltage of a semiconductor can be positively correlated with the end of life of the semiconductor.

The use of an on-state voltage sensor as an indicator of the wire bond state of health in a power module is problematic. Critically, as opposed to a single semiconductor with a number of wire bonds used to carry the load current, a power module is composed of several semiconductors with a number of wires bonds for each semiconductor. A single wire bond lift off has a significantly lower impact on the measured on-state voltage of the equivalent circuit, the measured on-state voltage is significantly impacted by the current sharing and temperature of each individual semiconductor. In this case, the ageing state of the individual semiconductor may not be measurable due to the masking from the electrical connections of the parallel semiconductors. A detected increase of the on-state voltage does not convey information on which semiconductor is aged, and therefore the entire power module must be considered a risk for a critical failure and should be replaced.

SUMMARY OF INVENTION

The present invention aims to allow an efficient monitoring of the connections of semiconductors of a power module using a per-semiconductor buffer, allowing the individual control of each semiconductor in order to easily detect a degraded state, to identify which semiconductor has significantly aged, and remove this semiconductor from the operation to continue the operation of the power module without an increased risk of a critical short circuit.

To that end, the present invention concerns a device for monitoring the connections of semiconductors of a power module, the semiconductors being connected in parallel and providing voltage and current to a load according to a pulse width modulation, the device comprising, for each semiconductor, a driver for driving the gate of the semiconductor in order to set the semiconductor in a conducting state or non-conducting state at each cycle of the pulse width modulation, characterized in that the semiconductors are grouped in plural groups comprising at least one semiconductor and in that the device comprises: means for determining if the duration of the conducting state of the semiconductors in a first cycle of the pulse width modulation is upper than a predetermined duration, means for measuring, during the conducting state of the semiconductors at a second cycle of the pulse width modulation, the voltage provided to the load by the semiconductors if the duration of the conducting state of the semiconductors in the first cycle of the pulse width modulation is upper than the predetermined value, means for sequentially disabling the conduction of each group of at least one semiconductor during a part of the duration of the conducting state of the semiconductors in a third cycle of the pulse width modulation and for measuring the voltage provided to the load each time the conduction of one group of at least one semiconductor is disabled, means for determining the differences between the voltage measured during the second cycle and each voltage measured during the third cycle, means for ordering the differences according to the values of the differences, means for checking if the determined order is identical to an order stored in a memory of the device, means for determining that the connection of one semiconductor of one group of at least one semiconductor is deteriorated if the determined order is different from the order stored in the memory of the device.

The present invention concerns also a method, executed by a controller, for monitoring the connections of semiconductors of a power module, the semiconductors being connected in parallel and providing voltage and current to a load according to a pulse width modulation, the controller comprising, for each semiconductor, a driver for driving the gate of the semiconductor in order to set the semiconductor in a conducting state or non-conducting state at each cycle of the pulse width modulation, characterized in that the semiconductors are grouped in plural groups comprising at least one semiconductor and in that the method comprises the steps of:

determining if the duration of the conducting state of the semiconductors in a first cycle of the pulse width modulation is upper than a predetermined duration, measuring, during the conducting state of the semiconductors at a second cycle of the pulse width modulation, the voltage provided to the load by the semiconductors if the duration of the conducting state of the semiconductors in the first cycle of the pulse width modulation is upper than the predetermined value, sequentially disabling the conduction of each group of at least one semiconductor during a part of the duration of the conducting state of the semiconductors in a third cycle of the pulse width modulation and measuring the voltage provided to the load each time the conduction of one group of at least one semiconductor is disabled, determining the differences between the voltage measured during the second cycle and each voltage measured during the third cycle, ordering the differences according to the values of the differences, checking if the determined order is identical to an order stored in a memory of the device, determining that the connection of one semiconductor of one group of at least one semiconductor is deteriorated if the determined order is different from the order stored in the memory of the device.

Thus, the deterioration of a semiconductor is detected independently of the operational state of the power module.

According to a particular feature, the device further comprises means for deactivating the conducting of the group of at least one semiconductor of which one connection is deteriorated after the third cycle.

Thus, the resolution required for the analogue to digital converter is reduced, and the cost of the monitoring system is reduced.

According to a particular feature, the device further comprises means for notifying the deterioration of the connection.

Thus, the state of health of the power module can be communicated to the user for maintenance purposes.

According to a particular feature, the predetermined duration is equal to 75% of the total duration of the first cycle.

Thus, measured voltage is dominated by the connection resistance of the power module, reducing the sensitivity required of the analogue to digital converter and reducing the implementation cost.

According to a particular feature, the device further comprises:

means for checking if the voltage measured during the second cycle is upper than a predetermined voltage value and, if the voltage measured during the second cycle is upper than a predetermined voltage value, means for disabling the means for sequentially disabling the conduction of each group of at least one semiconductor during the part of the duration of the conducting state of the semiconductors in the third cycle of the pulse width modulation and the means for measuring the voltage provided to the load each time the conduction of one group of at least one semiconductor is disabled.

Thus, the sensitivity requirement of the analogue to digital converter is reduced, as the sensitivity to the connection resistance for each individual semiconductor is maximized.

According to a particular feature, the predetermined voltage value is equal to 2.5 volts.

Thus, in a typical semiconductor device, this voltage is significantly higher than the saturation voltage, thereby indicating that the semiconductor is conducting a significant amount of load current, and thus, the sensitivity of the voltage to the connection resistance is maximized.

According to a particular feature, each group comprises at least two semiconductors and the device further comprises:

means for determining, if one of the connections is deteriorated, if the duration of the conducting state of the semiconductors in a fourth cycle of the pulse width modulation is upper than a predetermined duration, means for measuring, if one of the connections is deteriorated, during the conducting state of the semiconductors of the group comprising the deteriorated connection, at a fifth cycle of the pulse width modulation, the voltage provided to the load by the semiconductors if the duration of the conducting state of the semiconductors in the fourth cycle of the pulse width modulation is upper than the predetermined value, means for sequentially disabling, if one of the connections is deteriorated, the conduction of each semiconductor of the group comprising the deteriorated connection during a part of the duration of the conducting state of the semiconductors in a sixth cycle of the pulse width modulation and for measuring the voltage provided to the load each time the conduction of one group of at least one semiconductor is disabled, means for determining, if one of the connections is deteriorated, the differences between the voltage measured during the fifth cycle and each voltage measured during the sixth cycle, means for ordering, if one of the connections is deteriorated, the differences according to the values of the differences, means for checking, if one of the connections is deteriorated, if the determined order is identical to an order stored in a memory of the device, means for determining that the connection of one semiconductor is deteriorated if the determined order is different from the order stored in the memory of the device.

BRIEF DESCRIPTION OF DRAWINGS

The characteristics of the invention will emerge more clearly from a reading of the following description of example embodiments, the said description being produced with reference to the accompanying drawings, among which.

DESCRIPTION OF EMBODIMENTS

Figure 1:
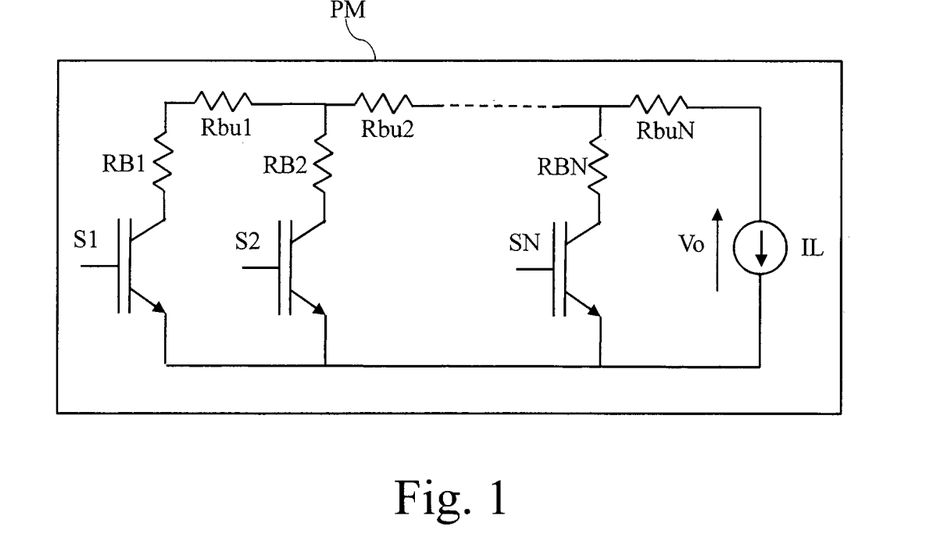
FIG. 1 represents an example of a power module composed of plural semiconductors the connections of which are monitored by the present invention.

FIG. 1 represents an example of a power module composed of plural semiconductors the connections of which are monitored by the present invention.

The power module PM comprises plural semiconductors S1 to SN connected in parallel. The equivalent resistance of the connections of the semiconductors S1 to SN to the bus and the respective bus resistances are represented in FIG. 1.

The resistance RB1 represents the resistance of the wire bonds of the semiconductor S1, the resistance RB2 represents the resistance of the wire bonds of the semiconductor S2 and the resistance RBN represents the resistance of the wire bonds of the semiconductor SN.

The resistance Rbu1 represents the resistance of the bus for the semiconductor S1, the resistance Rbu2 represents the resistance of the bus for the semiconductor S2 and the resistance RbuN represents the resistance of the bus for the semiconductor SN.

The semiconductors S1 to SN provide an output voltage Vo and an output current IL to a load not shown in FIG. 1.

Figure 2:
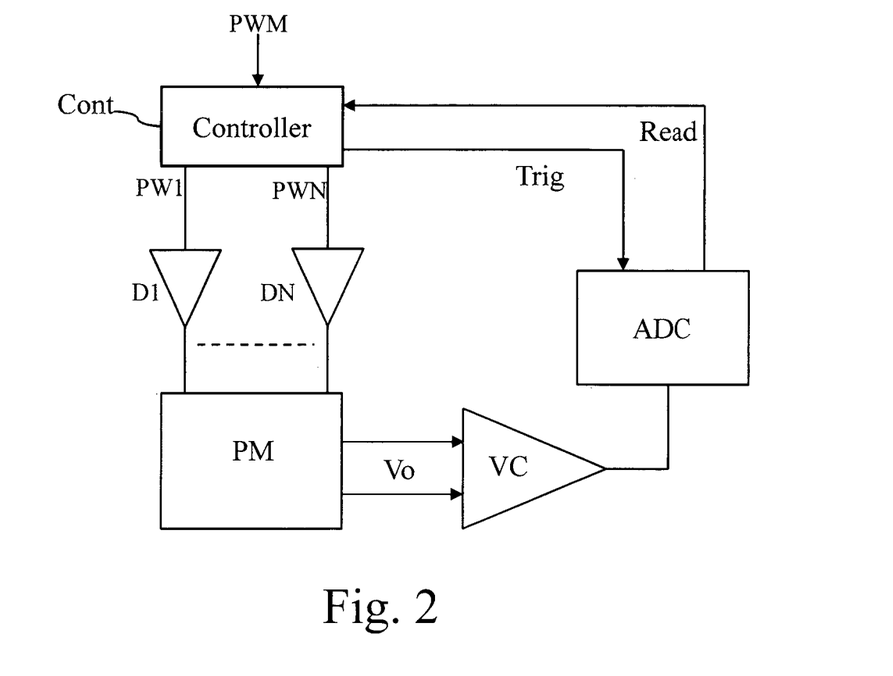
FIG. 2 represents the architecture of a system for monitoring the connections of semiconductors of a power module according to the present invention.

FIG. 2 represents the architecture of a system for monitoring the connections of semiconductors of a power module according to the present invention.

The system according to the present invention uses a per semiconductor gate buffer, a multi-input/output controller Cont, an on-state voltage sensor VC that senses the voltage Vo applied to the load, an analogue to digital converter ADC that converts the voltage Vo in a Read signal when the analogue to digital converter ADC is triggered by the controller Cont.

The on-state voltage sensor circuit VC and the analogue to digital converter ADC are able to measure the on-state voltage Vo, for example, at least with 10-bit resolution on a 5V scale, i.e. having an effective voltage resolution of 4-8 mV with a full scale range of 5V. The analogue to digital converter ADC receives the trigger signal Trig to start the sampling process that takes, for example, less than the shortest thermal time constant of the power module, i.e. typically 10-20 us.

The controller Cont receives a pulse width modulated signal PMW and, generates, from the received pulse width modulated signal, gate signals that are driven by the respective drivers D1 to DN.

The proposed method utilizes the components illustrated in the previous section to enhance the measurement sensitivity of the on-state voltage, and prevents a catastrophic failure by isolating the semiconductor. Hence, the temperature independent of the on-state voltage measurement state is described, and the means for isolating one semiconductor after a fail is detailed.

In order to be efficient and simple to implement, the present invention aims to obtain information that are independent of the semiconductors temperatures and the current provided to the load.

The on-state voltage provided by a semiconductor can be expressed as:

$$V_o(T_j, i_L, t) = V_{sat}(T_j) + r_{ce}(T_j) \cdot i_L(t)$$

where $T_j$ is the junction temperature, $i_L$ is the current provided to the load, t is the time, $V_{sat}$ the saturation voltage of the semiconductor and $r_{ce}$ is the resistance between the bus and the semiconductor.

Thus, the on-state voltage is dependent of two variables. Such dependency complicates the use of the on-state voltage sensor as a means of aging detection.

This is because the sensitivity of the on-state voltage to a change in $r_{ce}$ is less than the sensitivity of the on-state voltage to the junction temperature or load current, i.e. for the semiconductor Sn with n=1 to N, $$\frac{\partial V_o}{\partial r_{ce}} < \frac{\partial V_o}{\partial i_L} \text{ or } \frac{\partial V_o}{\partial T_j},$$

where $r_{ce}=f(r_S, RBn, RBun)$ where rs is the collector to emitter resistance of the semiconductor.

Hence, the junction temperature and load current are typically required in order to accurately resolve the state of degradation in the parasitic module resistance.

$$V_o(T_j, i_L, t) = V_{sat}(T_j) + r_{ce}(T_j) \cdot i_{load}(t)$$

The present invention, in the first step, fixes junction temperature and load current information for the purposes of sampling by two means by measuring the input duty cycle of the pulse width modulated signal is measured in duration at a first cycle noted 'p', and after a minimum period, i.e. 75% of the switching frequency of the pulse width modulated signal, the on-state voltage is sampled in the next switching period (at cycle 'p+1').

Once the on-state voltage is sampled, it is compared to a minimum threshold, for example, 2.5V. If the on-state voltage is above the minimum threshold, it is used as a reference, i.e. $V_o(0)$. In the following switching period "p+2", each semiconductor is successively deactivated and the on state voltage Vo(n) with n=1 to N is measured for each deactivation.

In this fashion, the process for measuring each successive output voltage only occurs after a minimum duty cycle and output voltage threshold. While the load current is assumed to vary over time, the average over two switching cycles is considered as negligible.

The average load current is approximately the same over two switching cycles, so too is the junction temperature, due to the differences in the thermal to electrical time constants.

As an example, the ambient temperature changes on the order of minutes to hours, and the junction to case temperature change is generally limited to the millisecond range, hence, $\langle T_j \rangle_p \approx \langle T_j \rangle_{p+1} \approx \langle T_j \rangle_{p+2}$. Therefore, the samples of Vo(n) are made at approximately the same average load current and junction temperature.

As each collection of Vo(n) samples is made at approximately the same load current and temperature, in order to compare these samples as a measure of degradation, the present invention removes the sensitivity of the load current magnitude and absolute temperature by using the measurement $\Delta Vo(n) = Vo(n) - Vo(n0)$, and saving the approximate order of magnitude during each update.

By setting the trigger value of the duty cycle correctly, the on-state voltage is dominated by the voltage drop across $r_{ce}$, i.e. the damage sensitive value, and each successive on-state voltage difference made when a semiconductor is disabled is proportional to the load current only. Since the junction temperature is approximately constant from cycle 'p' to 'p+2', the saturation voltage is approximately constant as this only depends on the junction temperature. Therefore, $\Delta Vo(n) \propto IL(t) \cdot r_{ce}(T_j)$ is approximately dependent on the load current only.

Since $\Delta Vo(n) \propto IL(t) \cdot r_{ce}(T_j)$ is the relative difference of two terms, the relative order of each magnitude $\Delta Vo(n)$ remains consistent for each sample, irrespective of the load current or temperature. Supposing that a single equivalent $r_{ce}$ value is associated with the resistive network when the semiconductor Sn is disabled, i.e. $r_{ce}(T_j)_n$, a relative increase or decrease of load current will not change the order of each measured voltage difference.

With a total of N semiconductors in the power module, $$\forall |IL(t)| \rightarrow \Delta Vo(n) > \Delta Vo(n-1) > \ldots > \Delta Vo(n-N)$$

if $r_{ce}(T_j)_n > r_{ce}(T_j)_{n-1} > \ldots > r_{ce}(T_j)_{n-N}$.

Therefore, the order of the measured voltage differences for each disabled semiconductor Sn in the power module reflects the baseline resistive network in the power module. Thus, as the power module ages, and a sudden increase in the equivalent terminal resistance due to wire bond lift off is experienced, the relative order changes and the faulted semiconductor can be identified. The faulted semiconductor can be determined based on the relative change in the order of the voltage differences measurements.

Figure 3:
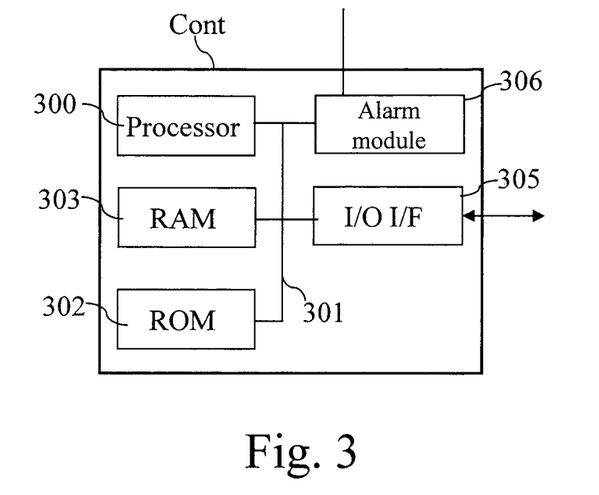
FIG. 3 represents an example of an architecture of a controller for monitoring the connections of semiconductors of a power module according to the present invention.

FIG. 3 represents an example of an architecture of a controller for monitoring the connections of semiconductors of a power module according to the present invention.

Figure 7:
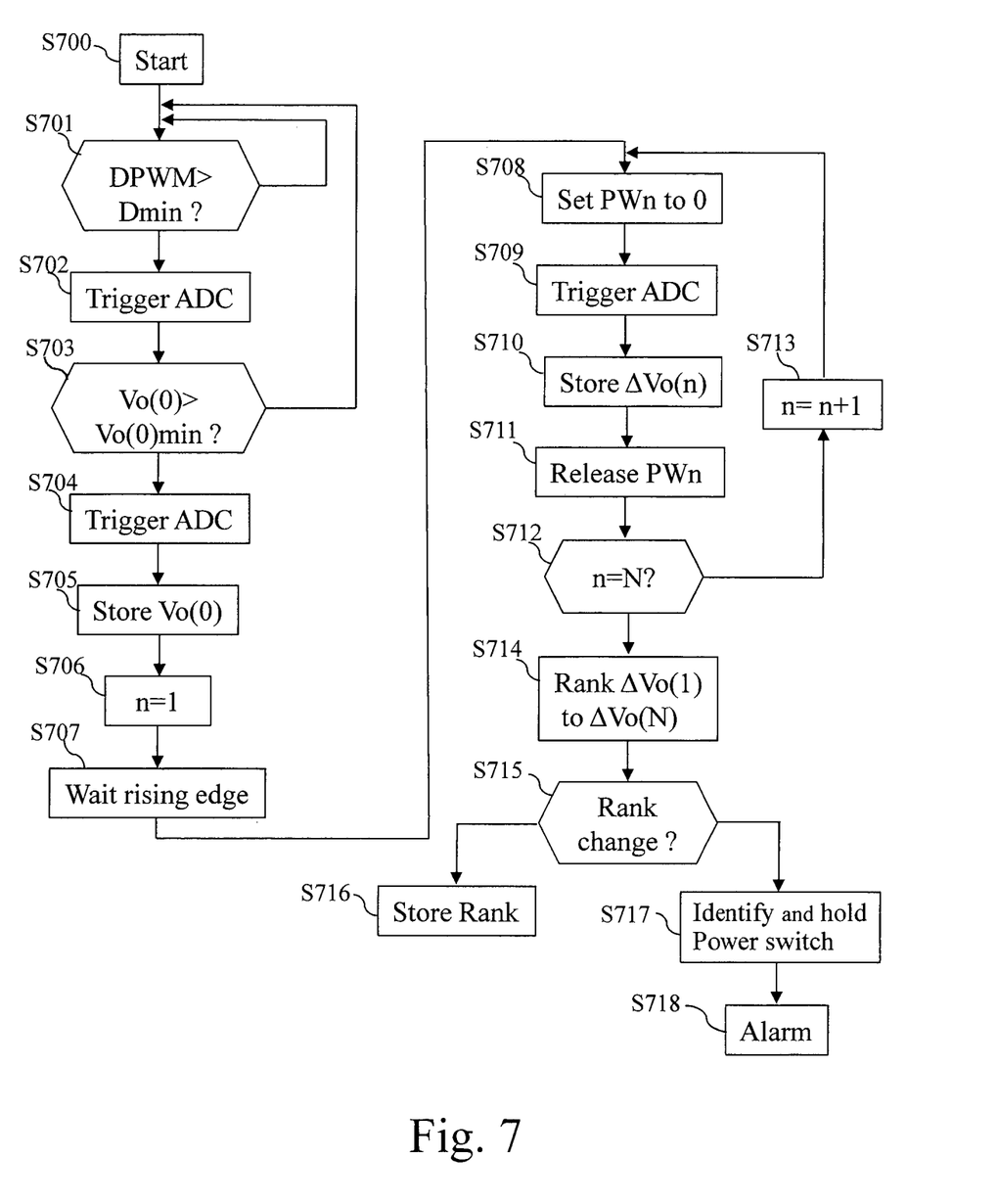
FIG. 7 represents an algorithm executed by the controller according to the present invention.

The controller Cont has, for example, an architecture based on components connected together by a bus 301 and a processor 300 controlled by the program as disclosed in FIG. 7.

The bus 301 links the processor 300 to a read only memory ROM 302, a random access memory RAM 303, an input output interface 305 and an alarm module 306.

The memory 303 contains registers intended to receive variables and the instructions of the programs related to the algorithm as disclosed in FIG. 7.

The read only memory 302 contains instructions of the programs related to the algorithm as disclosed in FIG. 7, which are transferred, when the controller Cont is powered on, to the random access memory 303.

Any and all steps of the algorithm described hereafter with regard to FIG. 7 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller Cont includes circuitry, or a device including circuitry, causing the controller Cont to perform the steps of the algorithms described hereafter with regard to FIG. 7.

Figure 4:
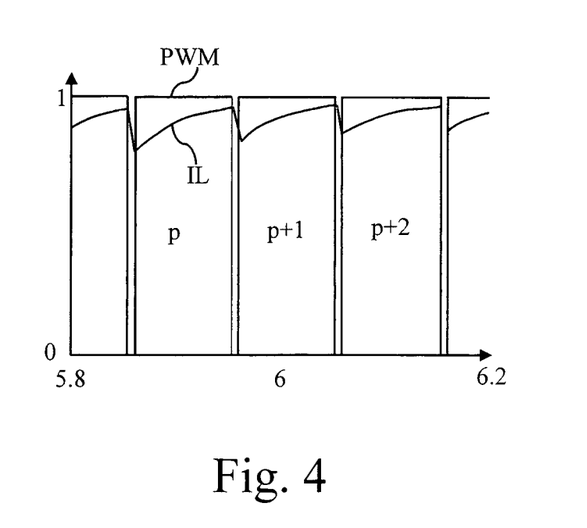
FIG. 4 represents variations of the load current delivered by the power module when the power module is controlled using pulse width modulation.

FIG. 4 represents variations of the load current delivered by the power module when the power module is controlled using pulse width modulation.

The horizontal axis represents the time in milliseconds and the vertical axis represents the current variation of the load current IL or the voltage variations of the pulse width modulation signal PWM.

In the FIG. 4, the load current IL and the signal PWM are represented in the cycles "p", "p+1" and "p+2".

Figure 5:
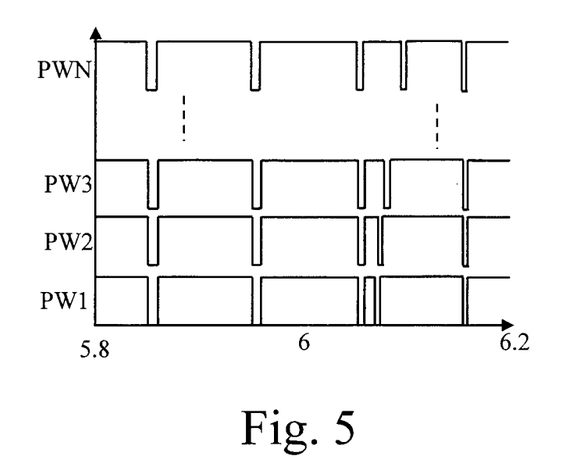
FIG. 5 represents variations of different pulse width modulation signals that are used, according to the present invention, for monitoring the connections of semiconductors of a power module.

FIG. 5 represents variations of different pulse width modulation signals that are used, according to the present invention, for monitoring the connections of semiconductors of a power module.

The horizontal axis represents the time in milliseconds and the vertical axis represents the voltage variations of the pulse width modulation signals.

In the FIG. 5, the pulse width modulation signals PW1 to PWN are represented in the cycles "p", "p+1" and "p+2". In the cycle p+2, the gate signal of each semiconductor S1 to SN is disabled sequentially.

Figure 6:
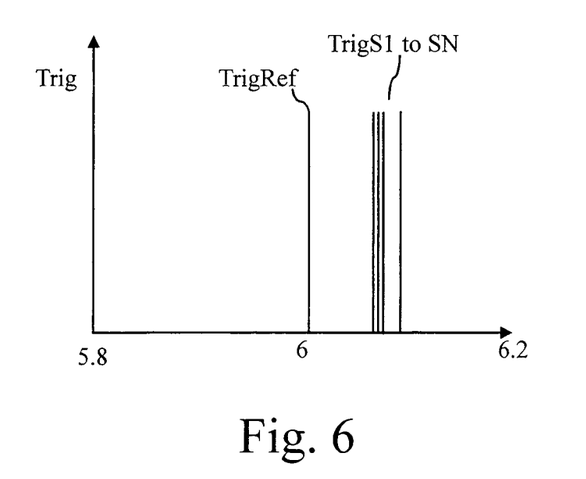
FIG. 6 represents the signal for triggering the analogue to digital converter in order to monitor the connections of semiconductors of a power module.

FIG. 6 represents the signal for triggering the analogue to digital converter in order to monitor the connections of semiconductors of a power module.

The horizontal axis represents the time in milliseconds and the vertical axis represents the voltage variations of the Trig signal provided to the analogue to digital converter modulation signals.

In the example of FIG. 6, the signal noted Trigref is the analogue to digital converter signal from triggering the measurement of Vo(0) and the signals noted Trigref are the analogue to digital converter signal from triggering the measurements Vo(1) to Vo(N).

FIG. 7 represents an algorithm executed by the controller according to the present invention.

The algorithm of FIG. 7 is disclosed in an example wherein it is executed by the processor 300 of the controller Cont.

At step S700, the algorithm starts. The present algorithm is for example executed periodically, for example every few days or hours, depending on the usage of the power module.

At step S701, the processor 300 checks, during the first cycle p, if the input duty cycle DPWM of the pulse width modulated signal PWM is at least equal to a given duration Dmin, for example equal to 75% of the switching frequency of the pulse width modulated signal.

If the input duty cycle DPWM of the pulse width modulated signal PWM is at least equal to the given duration Dmin, the processor 300 moves to step S702. Otherwise, the processor 300 returns to step S701 and considers a new first pulse width modulation cycle p.

At step S702, the processor 300 commands the triggering of the analogue to digital converter ADC for a sampling of the on-state voltage during the same switching cycle (at cycle 'p').

Once the on-state voltage is sampled, the processor 300 compares at step S703 the value of the sampled on-state voltage to a minimum threshold Vo (min) that is for example equal to 2.5V. If the on-state voltage value is above the minimum threshold, the processor 300 moves to step S704. Otherwise, the processor 300 returns to step S701.

A next step S704, the processor 00 commands the triggering of the analogue to digital converter ADC for a sampling of the on-state voltage in the next switching cycle (at cycle 'p+1').

At next step S705, the processor 300 memorizes the on-state voltage value as Vo(0).

At next step S706, the processor 300 sets the value of the variable n equal to 1.

At next step S707, the processor 300 waits for a rising edge of the pulse width modulation signal PWM that corresponds to a following switching period "p+2".

At next step S708, the processor 300 sets the signal PWn to null, i.e. deactives the gate signal PWn of the semiconductor Sn.

A next step S709, the processor 00 commands the triggering of the analogue to digital converter ADC for a sampling of the on-state voltage Vo(n).

At next step S710, the processor 300 memorizes the difference of value $\Delta Vo(n)=Vo(n)-Vo(0)$.

At next step S711, the processor 300 activates the signal PWn.

At next step S712, the processor 300 checks if the value of the variable n is equal to N. If the value of the variable n is equal to N, the processor 300 moves to step S714. Otherwise, the processor 300 moves to step S713.

At step S713, the processor 300 increments the value of n by one and returns to step S708.

At step S714, the processor 300 ranks the semiconductors S1 to SN using the memorized difference of values $\Delta Vo(1)$ to $\Delta Vo(N)$ from the highest value to the lowest value.

Typically, the rank is determined based on a numerical quantity, i.e.

$$\Delta Vo(1) > \Delta Vo(2) > \ldots \Delta Vo(n)$$

According to a particular feature, a margin of a error is introduced, i.e. $\Delta Vo(n) \equiv \Delta \overline{Vo}(n) + \alpha$, where $\Delta \overline{Vo}(n)$ is the measured difference of a semiconductor, as per step S710.

This allows us to avoid the rank continuously changing when the difference is less than the measurement precision of the analogue to digital converter.

At step S715, the processor 300 checks if the ranking of the semiconductors S1 to SN is the same as the one stored at a previous execution of the present algorithm.

If the ranking of the semiconductors S1 to SN is the same as the one stored at a previous execution of the present algorithm, the processor 300 moves to step S716, memorizes the ranks and interrupts the present algorithm. Otherwise, the processor moves to step S717.

Figure 8:
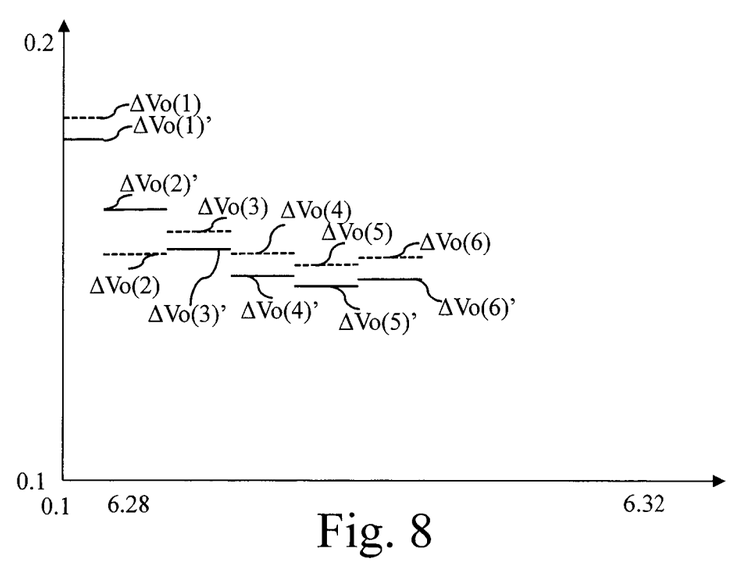
FIG. 8 represents examples of measured difference of voltages measured according to the present invention.

FIG. 8 represents examples of measured difference of voltages measured according to the present invention.

In the example of FIG. 8, N=6. The differences of voltages values $\Delta Vo(1)'$ to $\Delta Vo(N)'$ correspond to values stored at the previous execution of the present algorithm and the differences of voltages values $\Delta Vo(1)$ to $\Delta Vo(N)$ correspond to values stored at the current execution of the present algorithm.

In the example of FIG. 8, the values $\Delta Vo(1)$, $\Delta Vo(3)$, $\Delta Vo(4)$ $\Delta Vo(5)$ to $\Delta Vo(6)$ are higher than the values $\Delta Vo(1)'$, $\Delta Vo(3)'$, $\Delta Vo(4)'$ $\Delta Vo(5)'$ to $\Delta Vo(6)'$.

The value $\Delta Vo(2)$ is lower than the value $\Delta Vo(2)$ Such difference is due to the fact that a fault exists in the bond wires of the semiconductor S2, causing the current to increase in the other semiconductors and to decrease in the bond wires of the semiconductor S2.

As the values $\Delta Vo(1)$, $\Delta Vo(3)$, $\Delta Vo(4)$ $\Delta Vo(5)$ to $\Delta Vo(6)$ are higher than the values $\Delta Vo(1)'$, $\Delta Vo(3)'$, $\Delta Vo(4)'$ $\Delta Vo(5)'$ to $\Delta Vo(6)'$ i.e. they do not follow $\Delta Vo(2)$ behavior, it means that the resistance value RB2 for the semiconductor S2 has increased. The rank is then changed.

It has to be noted here that an increase of the current provided to the load by +20% or a decrease by 10% of the current provided to the load has no impact on the relative order of each $\Delta Vo(n)$ with n=1 to N. Hence, so long as the duty cycle and sampled voltage limit is properly defined, the method is independent of the loading current and temperature.

Figure 9A:
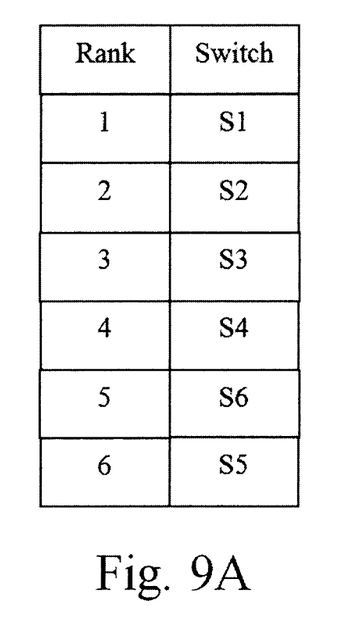
FIG. 9A represents tables that are used according to the present invention for monitoring the connections of semiconductors of a power module.
Figure 9B:
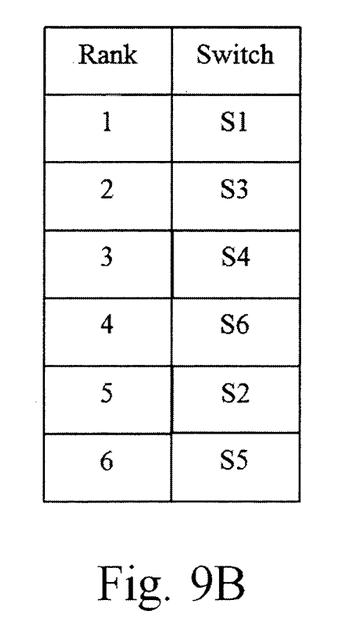
FIG. 9B represents tables that are used according to the present invention for monitoring the connections of semiconductors of a power module.

FIGS. 9A and 9B represent tables that are used according to the present invention for monitoring the connections of semiconductors of a power module.

The FIG. 9A is the table representing the ranking of the semiconductors at the previous iteration of the present algorithm. As shown in FIG. 9A, the rank of the semiconductors S1 to S6 is changed. The semiconductor S2 rank changes from the second rank to the fifth.

At step S717 and according to the example of FIGS. 8, 9A, and 9B, the processor 300 identifies that the semiconductor S2 has been deteriorated and disables the providing of the gate signal PW2.

At next step S718, the processor 300 commands the generation of an alarm signal through the alarm module 306 and interrupts the present algorithm.

It has to be noted here that the present invention has been disclosed in an example wherein the deterioration of each semiconductor is monitored. The present application is also applicable to groups of semiconductors. Instead of deactivating one semiconductor, two or more semiconductors are deactivated simultaneously. In that case, the present invention, during a first phase, orders each semiconductor of each group of semiconductors, orders the groups of semiconductors in a second phase, in a third phase sequentially deactivates groups of semiconductors in order to identify a deterioration of one semiconductor of a group of semiconductors among the plural groups of semiconductors. Once the group of semiconductors comprising the deteriorated semiconductor is identified, the present invention may monitor each semiconductor of the group of semiconductors comprising the deteriorated semiconductor in order to identify the deteriorated semiconductor among the semiconductors of the group of semiconductors comprising the deteriorated semiconductor.

The invention claimed is:

1. A device for monitoring connections of semiconductors of a power module, the semiconductors being connected in parallel and providing voltage and current to a load according to a pulse width modulation, the device comprising, for each semiconductor, a driver for driving a gate of the semiconductor in order to set the semiconductor in a conducting state or non-conducting state at each cycle of the pulse width modulation, characterized in that the semiconductors are grouped in plural groups comprising at least one semiconductor and in that the device comprises:
    determining circuitry to determine if a duration of the conducting state of the semiconductors in a first cycle of the pulse width modulation is upper than a predetermined duration,
    measuring circuitry to measure, during the conducting state of the semiconductors at a second cycle of the pulse width modulation, the voltage provided to the load by the semiconductors if the duration of the conducting state of the semiconductors in the first cycle of the pulse width modulation is upper than a predetermined value,
    first disabling circuitry to sequentially disable the conduction of each group of at least one semiconductor during a part of the duration of the conducting state of the semiconductors in a third cycle of the pulse width modulation and measuring circuitry to measure the voltage provided to the load each time the conduction of one group of at least one semiconductor is disabled,
    determining circuitry to determine differences between the voltage measured during the second cycle and each voltage measured during the third cycle,
    ordering circuitry to order the differences according to the values of the differences, checking circuitry to check if the determined order is identical to an order stored in a memory of the device,
    determining circuitry to determine that a connection of one semiconductor of one group of at least one semiconductor is deteriorated if the determined order is different from the order stored in the memory of the device.

2. The device according to claim 1, characterized in that the device further comprises deactivating circuitry to deactivate the conducting of the group of at least one semiconductor of which one connection is deteriorated after the third cycle.

3. The device according to claim 2, characterized in that the device further comprises notifying circuitry to notify the deterioration of the connection.

4. The device according to claim 2, characterized in that the predetermined duration is equal to 75% of the total duration of the first cycle.

5. The device according to claim 2, characterized in that the device further comprises:
    checking circuitry to check if the voltage measured during the second cycle is upper than a predetermined voltage value and, if the voltage measured during the second cycle is upper than a predetermined voltage value,
    second disabling circuitry to disable the first disabling circuitry and the measuring circuitry.

6. The device according to claim 5, characterized in that the predetermined voltage value is equal to 2.5 volts.

7. The device according to claim 2, characterized in that each group comprises at least two semiconductors and in that the device further comprises:
- determining circuitry to determine, if one of the connections is deteriorated, if the duration of the conducting state of the semiconductors in a fourth cycle of the pulse width modulation is upper than a predetermined duration,
- measuring circuitry to measure, if one of the connections is deteriorated, during the conducting state of the semiconductors of the group comprising the deteriorated connection, at a fifth cycle of the pulse width modulation, the voltage provided to the load by the semiconductors if the duration of the conducting state of the semiconductors in the fourth cycle of the pulse width modulation is upper than the predetermined value,
- disabling circuitry to sequentially disable, if one of the connections is deteriorated, the conduction of each semiconductor of the group comprising the deteriorated connection during a part of the duration of the conducting state of the semiconductors in a sixth cycle of the pulse width modulation and for measuring the voltage provided to the load each time the conduction of one group of at least one semiconductor is disabled,
- determining circuitry to determine, if one of the connections is deteriorated, the differences between the voltage measured during the fifth cycle and each voltage measured during the sixth cycle,
- ordering circuitry to order, if one of the connections is deteriorated, the differences according to the values of the differences,
- checking circuitry to check, if one of the connections is deteriorated, if the determined order is identical to an order stored in a memory of the device,
- determining circuitry to determine that the connection of one semiconductor is deteriorated if the determined order is different from the order stored in the memory of the device.

8. The device according to claim 1, characterized in that the device further comprises notifying circuitry to notify the deterioration of the connection.

9. The device according to claim 8, characterized in that the predetermined duration is equal to 75% of the total duration of the first cycle.

10. The device according to claim 8, characterized in that the device further comprises:
- checking circuitry to check if the voltage measured during the second cycle is upper than a predetermined voltage value and, if the voltage measured during the second cycle is upper than a predetermined voltage value,
- second disabling circuitry to disable the first disabling circuitry and the measuring circuitry.

11. The device according to claim 10, characterized in that the predetermined voltage value is equal to 2.5 volts.

12. The device according to claim 8, characterized in that each group comprises at least two semiconductors and in that the device further comprises:
- determining circuitry to determine, if one of the connections is deteriorated, if the duration of the conducting state of the semiconductors in a fourth cycle of the pulse width modulation is upper than a predetermined duration,
- measuring circuitry to measure, if one of the connections is deteriorated, during the conducting state of the semiconductors of the group comprising the deteriorated connection, at a fifth cycle of the pulse width modulation, the voltage provided to the load by the semiconductors if the duration of the conducting state of the semiconductors in the fourth cycle of the pulse width modulation is upper than the predetermined value,
- disabling circuitry to sequentially disable, if one of the connections is deteriorated, the conduction of each semiconductor of the group comprising the deteriorated connection during a part of the duration of the conducting state of the semiconductors in a sixth cycle of the pulse width modulation and for measuring the voltage provided to the load each time the conduction of one group of at least one semiconductor is disabled,
- determining circuitry to determine, if one of the connections is deteriorated, the differences between the voltage measured during the fifth cycle and each voltage measured during the sixth cycle,
- ordering circuitry to order, if one of the connections is deteriorated, the differences according to the values of the differences,
- checking circuitry to check, if one of the connections is deteriorated, if the determined order is identical to an order stored in a memory of the device,
- determining circuitry to determine that the connection of one semiconductor is deteriorated if the determined order is different from the order stored in the memory of the device.

13. The device according to claim 1, characterized in that the predetermined duration is equal to 75% of the total duration of the first cycle.

14. The device according to claim 1, characterized in that the device further comprises:
- checking circuitry to check if the voltage measured during the second cycle is upper than a predetermined voltage value and, if the voltage measured during the second cycle is upper than a predetermined voltage value,
- second disabling circuitry to disable the first disabling circuitry and the measuring circuitry.

15. The device according to claim 14, characterized in that the predetermined voltage value is equal to 2.5 volts.

16. The device according to claim 1, characterized in that each group comprises at least two semiconductors and in that the device further comprises:
- determining circuitry to determine, if one of the connections is deteriorated, if the duration of the conducting state of the semiconductors in a fourth cycle of the pulse width modulation is upper than a predetermined duration,
- measuring circuitry to measure, if one of the connections is deteriorated, during the conducting state of the semiconductors of the group comprising the deteriorated connection, at a fifth cycle of the pulse width modulation, the voltage provided to the load by the semiconductors if the duration of the conducting state of the semiconductors in the fourth cycle of the pulse width modulation is upper than the predetermined value,
- disabling circuitry to sequentially disable, if one of the connections is deteriorated, the conduction of each semiconductor of the group comprising the deteriorated connection during a part of the duration of the conducting state of the semiconductors in a sixth cycle of the pulse width modulation and for measuring the voltage provided to the load each time the conduction of one group of at least one semiconductor is disabled, determining circuitry to determine, if one of the connections is deteriorated, the differences between the voltage measured during the fifth cycle and each voltage measured during the sixth cycle, ordering circuitry to order, if one of the connections is deteriorated, the differences according to the values of the differences, checking circuitry to check, if one of the connections is deteriorated, if the determined order is identical to an order stored in a memory of the device, determining circuitry to determine that the connection of one semiconductor is deteriorated if the determined order is different from the order stored in the memory of the device.

17. A method, executed by a controller, for monitoring connections of semiconductors of a power module, the semiconductors being connected in parallel and providing voltage and current to a load according to a pulse width modulation, the controller comprising, for each semiconductor, a driver for driving the gate of the semiconductor in order to set the semiconductor in a conducting state or non-conducting state at each cycle of the pulse width modulation, characterized in that the semiconductors are grouped in plural groups comprising at least one semiconductor and in that the method comprises the steps of:

determining if a duration of the conducting state of the semiconductors in a first cycle of the pulse width modulation is upper than a predetermined duration, measuring, during the conducting state of the semiconductors at a second cycle of the pulse width modulation, the voltage provided to the load by the semiconductors if the duration of the conducting state of the semiconductors in the first cycle of the pulse width modulation is upper than a predetermined value, sequentially disabling the conduction of each group of at least one semiconductor during a part of the duration of the conducting state of the semiconductors in a third cycle of the pulse width modulation and for measuring the voltage provided to the load each time the conduction of one group of at least one semiconductor is disabled, determining differences between the voltage measured during the second cycle and each voltage measured during the third cycle, ordering the differences according to the values of the differences, checking if the determined order is identical to an order stored in a memory of the device, determining that a connection of one semiconductor of one group of at least one semiconductor is deteriorated if the determined order is different from the order stored in the memory of the device.

* * * * *